US005967848A

United States Patent [19]
Johnson et al.

[11] Patent Number: 5,967,848
[45] Date of Patent: Oct. 19, 1999

[54] APPARATUS FOR PROVIDING CONTROLLED IMPEDANCE IN AN ELECTRICAL CONTACT

[75] Inventors: David A. Johnson, Wayzata; Eric V. Kline, Stillwater, both of Minn.

[73] Assignee: JohnsTech International Corporation, Minneapolis, Minn.

[21] Appl. No.: 08/962,924

[22] Filed: Oct. 27, 1997

Related U.S. Application Data

[63] Continuation of application No. 08/384,544, Feb. 7, 1995, abandoned.

[51] Int. Cl.⁶ .................................................. H01R 9/09
[52] U.S. Cl. .................................... 439/620; 439/66
[58] Field of Search ..................... 439/66, 91, 591, 439/620, 69

[56] References Cited

U.S. PATENT DOCUMENTS

| | | | |
|---|---|---|---|
| 3,111,641 | 11/1963 | Wilentchik | 338/221 |
| 3,670,205 | 6/1972 | Dixon et al. . | |
| 3,778,752 | 12/1973 | Noyes | 439/620 |
| 3,880,493 | 4/1975 | Lockhart, Jr. | 339/147 R |
| 4,142,226 | 2/1979 | Mears . | |
| 4,161,692 | 7/1979 | Tarzwell | 324/158 |
| 4,250,482 | 2/1981 | Kouchich et al. | 338/221 |
| 4,520,429 | 5/1985 | Hosking . | |
| 4,695,115 | 9/1987 | Talend | 439/76 |
| 4,772,225 | 9/1988 | Ulery | 439/620 |
| 4,846,732 | 7/1989 | Meelhuysen | 439/620 |
| 4,853,659 | 8/1989 | Kling | 333/184 |
| 4,871,316 | 10/1989 | Herrell et al. | 439/66 |
| 4,983,910 | 1/1991 | Majidi-Ahy et al. | 324/158 P |
| 4,996,478 | 2/1991 | Pope | 324/158 P |
| 5,096,426 | 3/1992 | Simpson et al. | 439/66 |
| 5,246,389 | 9/1993 | Briones | 439/620 |
| 5,274,336 | 12/1993 | Crook et al. | 324/690 |
| 5,286,224 | 2/1994 | Paulus | 439/620 |
| 5,360,353 | 11/1994 | Kinoshita | 439/620 |
| 5,388,996 | 2/1995 | Johnson | 439/65 |
| 5,447,442 | 9/1995 | Swart | 439/700 |

FOREIGN PATENT DOCUMENTS

| | | |
|---|---|---|
| 0 423 821 A2 | 4/1991 | European Pat. Off. . |
| 0 487 984 A2 | 6/1992 | European Pat. Off. . |
| 0 498 530 A2 | 8/1992 | European Pat. Off. . |
| 0 632 545 A2 | 1/1995 | European Pat. Off. . |

OTHER PUBLICATIONS

IBM Technical Disclosure Bulletin, Stamped Connector, vol. 32, No. 7, p. 200, Dec. 1989.

*Primary Examiner*—Neil Abrams
*Attorney, Agent, or Firm*—Nawrocki, Rooney & Sivertson, P.A.

[57] ABSTRACT

An apparatus for providing a controlled impedance directly to predetermined contact elements within a socket, thereby reducing the "distorting" nature of the electrical interconnection system. In an illustrative embodiment of the present invention, predetermined contacts of a socket may have a resistance, inductance, capacitance, or a combination thereof incorporated therein. In another illustrative embodiment, at least one active element(s) may also be incorporated into predefined contacts. In this manner, predefined contacts may "process" the corresponding signal in a predetermined manner, defined by the circuitry incorporated on the contact itself. Illustrative functions that may be performed include, but are not limited to, amplifying, analog-to-digital converting, digital-to-analog converting, predefined logic functions, or any other function that may be performed via a combination of active and/or passive elements including a microprocessor function.

6 Claims, 5 Drawing Sheets

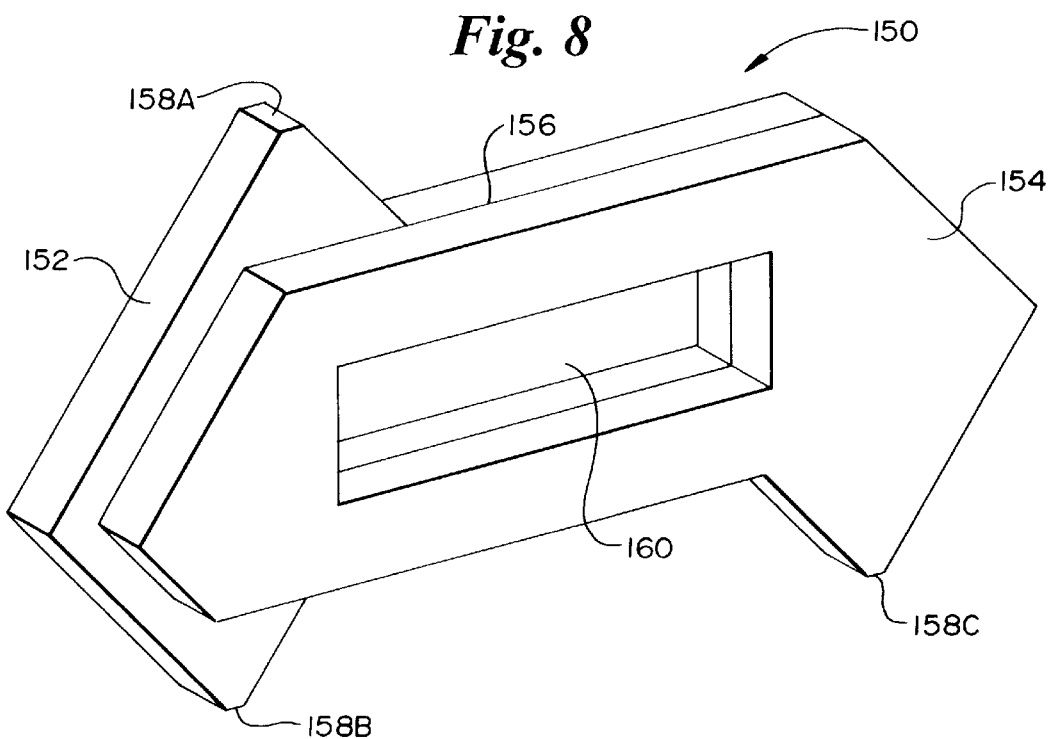
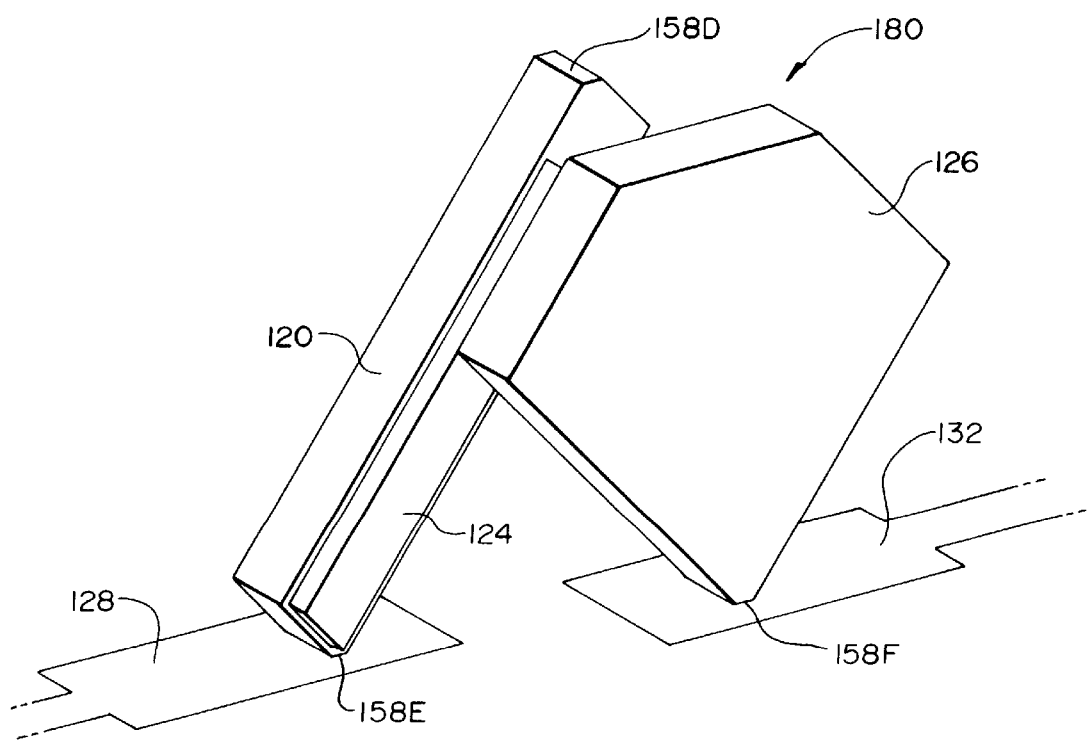

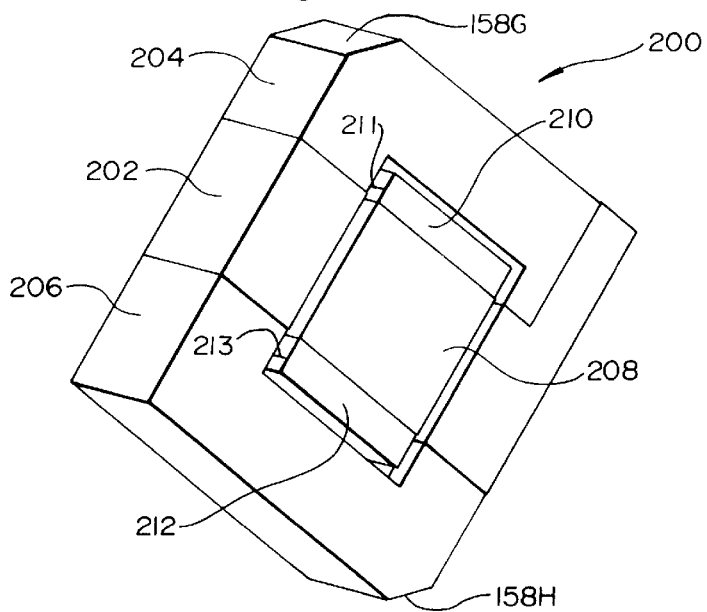
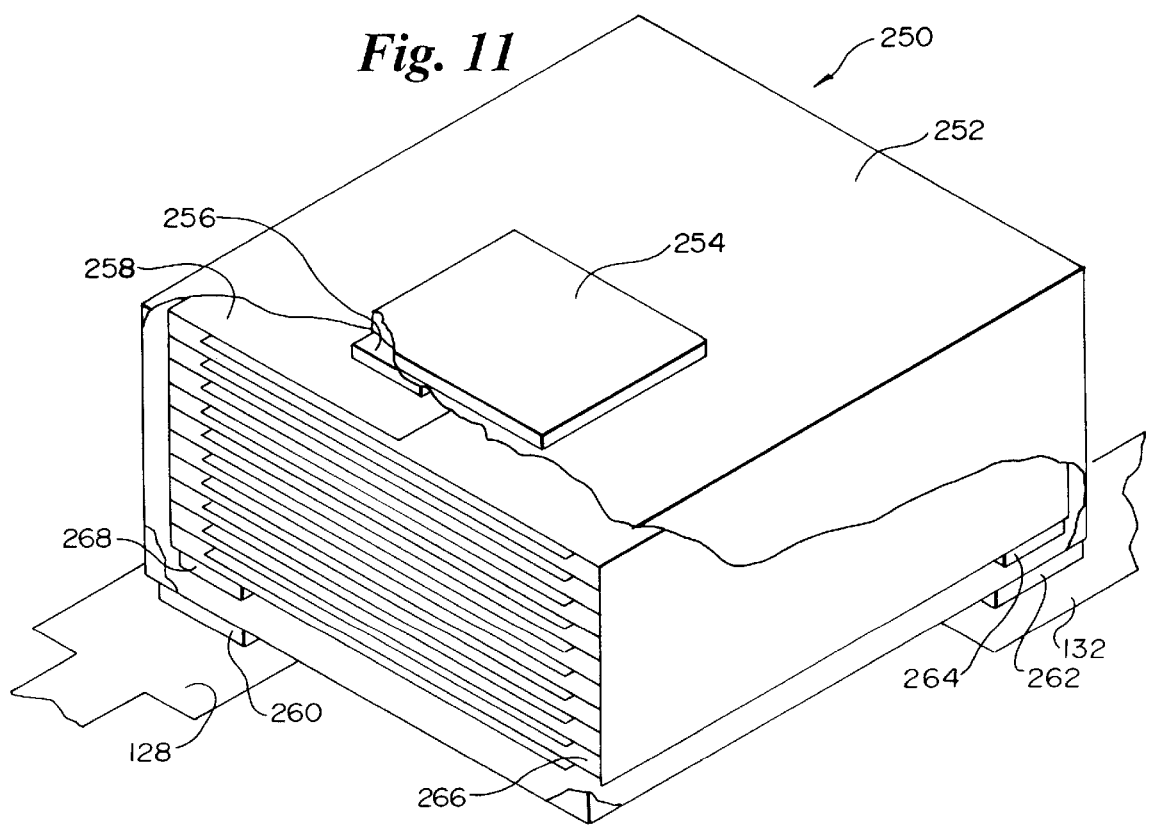

5,967,848

APPARATUS FOR PROVIDING CONTROLLED IMPEDANCE IN AN ELECTRICAL CONTACT

This is a file wrapper continuation of application Ser. No. 08/384,544 filed on Feb. 7, 1995, now abandoned.

TECHNICAL FIELD

The present invention is related to electrical interconnect systems and more particularly relates to high performance electrical interconnect systems which provide signal conditioning therein.

BACKGROUND OF THE INVENTION

A plethora of applications exist for effecting electrical contact between two conductors. Examples of such applications include cable connectors, PC board connectors, socket connectors, DIP carriers, etc. In an illustrative application, an interconnect system may effect an interconnection between a number of terminals on a first printed circuit board with a number of corresponding terminals on a second printed circuit board. Such apparatus are used to provide an electrical interface between two circuit boards. In another illustrative application, an interconnect system may effect an interconnection between a lead of an integrated circuit device and a conductive pad or terminal on a printed circuit board. The circuit board may then be coupled to a tester apparatus or other control means. Such apparatus are used to evaluate the performance of integrated circuit devices.

Numerous considerations bear upon the structure of an electrical interconnect system, including both electrical and mechanical considerations. For typical interconnection systems, special attention must be given to the electrical performance thereof including self inductance, resistance, capacitance, impedance matching characteristics, etc. Mechanical considerations including life span requirements, repairability or replacability, operating temperature requirements, etc., must also be considered. Finally, specific applications of an electrical interconnect system may yield a number of unique parameters which must also be considered. For example, in an interconnect system which provides an electrical interconnection between an integrated circuit lead and a printed circuit board terminal, various parameter must be considered including the coplanarity of the terminals, the mechanical manufacturing tolerances, and the device alignment and orientation of the device terminals relative to the interconnection system.

A main objective of an interconnection system is to maintain a non-distorting electrical interconnection between two terminals. To accomplish this, an interconnection system must be carefully designed to control the lead inductance and resistance, the lead-to-lead capacitance, the lead-to-ground capacitance, the electrical decoupling system, and the impedance matching characteristic of signal paths. All of these characteristics contribute, to some degree, to the distorting nature of the electrical interconnection system.

Various methods have been developed to help minimize the parasitic effects of the interrconnect system. A common method is to provide signal condition circuits adjacent the electro-mechanical contacts of the electrical interconnection system. The signal conditioning circuits, typically discrete elements such as termination components are used to adjust and control the circuit impedance. Because the requisite signal conditioning components and electromechanical contacts are physically separated, it is difficult to attain an ideal interconnect system, thereby compromising the accuracy, precision and reproducibility of the interconnect system.

One prior art structure is suggested in U.S. Pat. No. 4,260,762, issued on Apr. 29, 1975 to Lockhart, Jr. Lockhart suggests a test socket for interconnecting a dual-in-line integrated circuit package and a printed circuit board. A capacitor is provided in the body of the socket wherein the socket material provides the dielectric for the capacitor. The contacts of the capacitor are in contact with the socket connectors, which are in turn in contact with the integrated circuit package. That is, Lockhart suggests a test socket wherein the capacitor is provided in the socket body, rather than on the "load board" as previously discussed.

A scheme to connect a first circuit board containing a test socket to a coaxial probe card, and eventually to an IC tester is suggested in U.S. Pat. No. 4,996,487, issued on Feb. 26, 1991 to Pope. The first circuit board has an integrated circuit test socket connected thereto and traces from the integrated circuit test socket to plated through-holes and further to blind vias. The coaxial probe card then engages the blind vias to provide an electrical communication path between the IC tester and the integrated circuit test socket.

A method for reducing noise in a telephone jack is suggested in U.S. Pat. No. 4,695,115, issued on Sep. 22, 1987 to Talend. Talend suggests a modular jack for telephones in which discrete bypass capacitors are connected to the leads of the jack to filter out noise thereon. Talend contemplates using monolithic surface mount capacitors which extend to a ground plane in the modular jack element.

The use of a pi-network to reduce noise in a connector is suggested in U.S. Pat. No. 4,853,659, issued on Aug. 1, 1989 to Kling. Kling suggests using a planer pi-network filter comprising a pair of shunt capacitors and an inductive member in series therebetween. Kling contemplates using the pi-network filter in combination with cable connectors or the like.

A millimeter-wave probe for use in injecting signals with frequencies above 50 GHz is suggests in U.S. Pat. No. 4,983,910, issued on Jan. 8, 1991 to Majidi-Ahy et al. In Majidi-Ahy et al. an input impedance matching section couples the energy from a low pass filter to a pair of matched, anti-parallel, beam lead diodes. These diodes generate odd numbered harmonics which are passed through the diodes by an output impedance matching network.

Finally, a capacitively loaded probe which can be used for non-contact acquisition of both analog and digital signals is suggested in U.S. Pat. No. 5,274,336, issued on Dec. 28, 1993 to Crook et al. In Crook et al., the probe consists of a shielded probe tip, a probe body which is mechanically coupled to the probe tip, and an amplifier circuit disposed within the probe body.

SUMMARY OF THE INVENTION

The present invention overcomes many of the disadvantages of the prior art by providing a means for electrically affecting a signal directly within the contact elements of the interconnection system. It is contemplated that the present invention may be applied to any type of electrical interconnect system including, but are not limited to, cable connectors, PC board connectors, test socket connectors, DIP carriers, etc.

In an illustrative embodiment, the electrical interconnect system may comprise a number of contacts wherein a first portion of each contact may be brought into electrical communication with a corresponding first terminal. A second portion of each contact may be in electrical communication with a corresponding second terminal. To enhance the performance of the interconnect system, the present invention may provide a means for electrically affecting a signal directly within predetermined ones of the contacts. This may be accomplished by providing a controlled impedance therein.

A number of advantages may be achieved by providing a controlled impedance directly within the contact element. For example, in an integrated circuit test application, the maximum benefit of the controlled impedance may be achieved by having the controlled impedance located as close as possible to the integrated circuit lead. That is, the closer that the controlled impedance is placed to the integrated circuit lead, the greater the benefit the controlled impedance may have on reducing the distorting nature of the interconnect system. In the present embodiment, the controlled impedance may be coupled directly to the contacts within a corresponding test socket, rather than being placed on an adjacent load board or the like.

In one embodiment of the present invention, predetermined contacts of the socket may have a resistance, inductance, capacitance, and/or surface acoustical wave filer therein. Further, predetermined contacts of the socket may have a combination of the above reference elements, thereby forming a circuit. This additional impedance may be used for impedance matching purposes in order to reduce reflections or other noise mechanisms on a corresponding signal line. Further, the added impedance may be used to provide capacitive or inductive coupling to signal or power pins. That is, the controlled impedance may electrically affect a corresponding signal.

In another embodiment of the present invention, predetermined ones of the contacts of the socket may contact a number of independent signal traces on a load board. That is, each contact may electrically communicate with a number of independent signals on the load board, including the particular signal trace which corresponds to the particular semiconductor device lead.

In another embodiment of the present invention, predetermined contacts of the socket may have at least one active element incorporated thereon. For example, a contact may have a transistor, diode, etc. incorporated therein. Further, a contact may have a combination of transistors, diodes, resistors, capacitors, inductors, surface acoustical wave filters, gates, etc. to form a circuit therein. In this embodiment, the impedance of the contact may be selectively controlled by another independent signal, as described in the previous paragraph, by the logic level of the contact itself, or other control means.

It is recognized that the inclusion of an active element into a particular contact of a socket may have numerous applications. For example, a contact having just a single transistor incorporated therein may be used to control whether a semiconductor device, the tester, or other element is driving a corresponding signal trace. That is, the single transistor may be turned off, thereby substantially increasing the impedance thereof, such that the tester or other means may drive a corresponding signal trace without overdriving a corresponding output of the semiconductor device. Similarly, the single transistor may be turned on, thereby reducing the impedance thereof to a low level, allowing the semiconductor device to drive the signal trace back to the tester or other element. This may be especially useful with semiconductor devices that have bi-directional input/output pins. It is recognized that this is only one application of the present invention and that numerous other applications are contemplated.

As stated above, a number of active elements may be incorporated into predefined contacts of a socket to form a circuit therein. Inductors, capacitors, and resistors may also be incorporated therein and combined therewith. In this configuration, predefined contacts may "process" the corresponding signal in a predetermined manner, defined by the circuitry incorporated on the contact itself. For example, a number of transistors may be incorporated in a contact wherein the number of transistors may be arranged to provide an amplifier function. That is, the signal provided by the semiconductor device, the tester apparatus, or other means may be amplified by the contact of the socket. Other illustrative functions may include, but are not limited to, analog-to-digital converters, digital-to-analog converters, predefined logic functions, or any other function that may be performed via a combination of active and/or passive elements including a microprocessor function.

In another embodiment of the present invention, the impedance may be formed between two components within a connector. For example, two parallel and adjacent contacts may be separated by an insulating material thereby forming a capacitance therebetween. One of the contacts may be coupled to a power supply lead on the semiconductor device while an adjacent contact may be coupled directly to ground. This configuration may provide capacitance between the power supply and ground, thereby reducing noise on the power supply of the semiconductor device. This embodiment may also be used to provide isolation between signal lines or signal lines and a power supply/ground if desired. That is, a contact that is connected to ground may be placed between two signal contacts to reduce the amount of crosstalk therebetween. The contact may be shaped to control the amount of inductance on a given contact. It should be recognized that this is only an illustrative embodiment, and that other embodiments which provide impedance between at least two components of a connector are contemplated.

In another embodiment, the controlled impedance may be provided on, or incorporated in, predetermined ones of the plurality of contacts. In the simplest embodiment, a resistance provided by the contact itself may be changed by varying the material or the shape thereof. In a more complex embodiment, and not deemed to be limiting, a metal substrate (MS) may be utilized to create a controlled impedance on predetermined contacts. For example, two or more metal plates may be mechanically joined and electrically insulated from one another in such a way as to form impedance controlled (i.e., transmission line, stripline, and/or microstrip) electromechanical contacts. One metal plate may serve as the signal plane while an adjacent metal plate may serve as an electrical ground reference. Electrical insulation can be accomplished by a number of means including, application of thermal-setting dielectric coatings including polyimides, epoxies, urethanes, etc., application of thermoplastic coatings including polyethylene, etc., or by growing native oxide by anodization or thermal growth. These varied approaches may allow for control of impedance through a number of adjustable parameters including the dielectric constant of the insulating material and the plate separation. Mechanical joining may be accomplished by a number of means including, suspension by or between one or more elastomeric members and/or by referencing of the individual plates or sets of multiple plates within predefined mechanical constructs, such as slots within a housing.

In another embodiment, and not deemed to be limiting, a ceramic substrate (CS) may be utilized to create a controlled impedance on predetermined contacts. For example, patterned metal may be fabricated on a ceramic substrate in such a way as to yield an impedance controlled electromechanical contact. In an illustrative embodiment, a conventional thin-film multi-layer technology may provide a 3-terminal type capacitor wherein the first two terminals correspond to a signal I/O and the third terminal corresponds to a ground reference. It is also contemplated that the same impedance controlled 3-terminal type capacitor could be fabricated by a modified multi-layer thin-film process wherein the conductive phase is deposited on an inert/carrier substrate and patterned for selective oxidation using chemical anodization, plasma oxidation and/or thermal oxide growth, yielding conductive metal patterns within a dielectric. Finally, it is contemplated that the process could be repeated N-times to yield a multi-layer active contact structure of the 3-terminal type capacitor.

While the last two embodiments primarily provide an illustrative three terminal capacitor type device, it is envisioned that other conventional processes may be used to provide resistance, inductance, capacitance, and/or a combination thereof to predetermined contacts. It is further envisioned that conventional or other processes may be used to provide other active elements including, transistors, diodes, etc., and/or a combination thereof to predetermined contacts. Finally, it is envisioned that conventional or other processes may be used to provide a number of active and/or passive elements in a circuit configuration which may provide predefined functions, including a microprocessor function to predetermined contacts. In the above referenced embodiments, the electrical affecting means may be integrated with the contact itself.

Finally, the connector apparatus comprising the above referenced contacts may be designed such that each of the contacts may be interchanged with another contact. This may allow a contact having a inductor to be interchanged with another contact having a resistor. As can readily be seen, this may allow the connector apparatus to be configurable, even after the connector apparatus has been assembled and is in use. That is, the connector apparatus may be customized for a particular use, and even changed to accommodate a new use.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 8 is a perspective view of another embodiment of the present invention having native Grown Oxide on a Metal Substrate contact to form a controlled impedance therebetween;

FIG. 9 is a perspective view of a Metal Dielectric Sandwich embodiment having a Metal Substrate Contact;

FIG. 10 is a perspective view of a two terminal embodiment having a Ceramic Substrate Contact; and FIG. 11 is a perspective view of a three terminal embodiment having a Ceramic Substrate Contact.

DETAILED DESCRIPTION OF THE PREFERRED EMBODIMENTS

Figure 1:
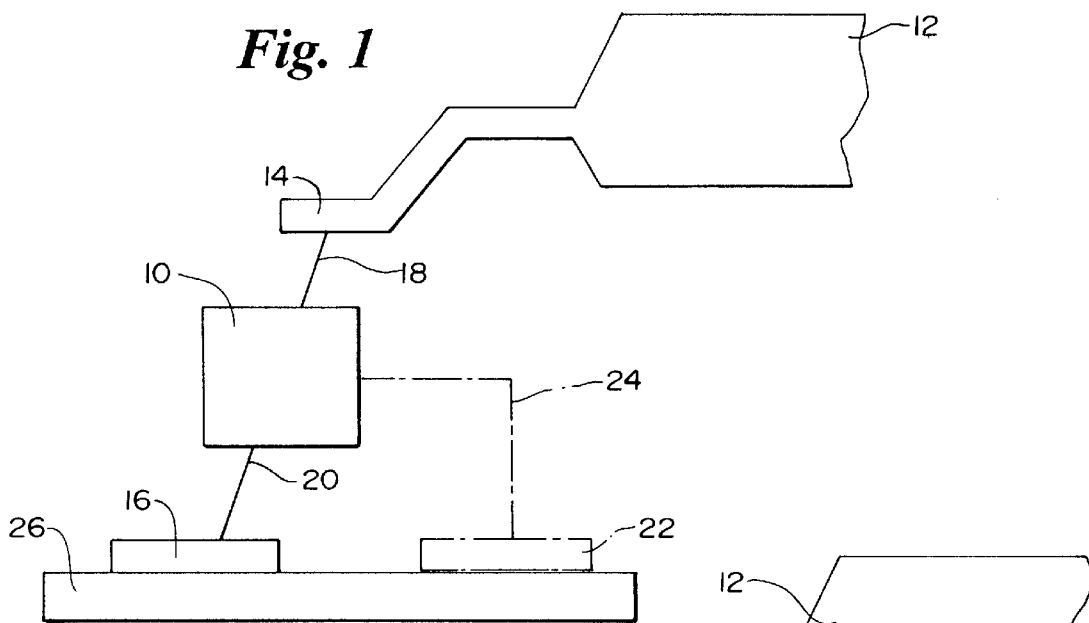
FIG. 1 is a schematic side view of an active contact coupled to a packaged semiconductor device and an interface board.

FIG. 1 is a schematic side view of an active contact coupled to a packaged semiconductor device and an interface board 26. An illustrative embodiment of the present invention may provide a controlled impedance directly to predetermined contact elements within a test socket, thereby reducing the "distorting" nature of the electrical interconnection system. It is further contemplated that the present invention may not be limited to test sockets, but rather may be applied to cable connectors, PC board connectors, test socket connectors, DIP carriers, etc.

A semiconductor device socket may comprise a number of contacts wherein a first portion of each contact may be brought into electrical communication with a corresponding lead of a semiconductor device. Another portion of each contact may be in electrical communication with a load board terminal or equivalent and subsequently with a tester of other test means. That is, each contact may provide a mechanical and an electrical connection between a load board terminal and a corresponding lead on a semiconductor device. To enhance the performance of the socket, the present invention may electrically affect a signal by providing a controlled impedance within predetermined ones of the contacts. The electrical affecting means may be integrated with the corresponding contact.

To obtain the maximum benefit of the controlled impedance which is added to an interconnect system, it is important to have the controlled impedance located as close as possible to the semiconductor device lead. That is, the closer that the controlled impedance is placed to the semiconductor device lead, the greater the benefits the controlled impedance may have on reducing the distorting nature of the interconnect system. In the present embodiment, the controlled impedance may be coupled directly to the contacts within the socket.

In the illustrative embodiment shown in FIG. 1, an active contact 10 may be coupled to a lead 14 of a packaged semiconductor 12 via interface 18. Further, active contact 10 may be coupled to at a load board terminal 16 via interface 20. Active contact 10 may also be coupled to at least one other load board terminal 22 via interface 24. Active contact 10 may provide both a mechanical and an electrical connection between packaged semiconductor lead 14 and load board terminals 16 and 22.

In accordance with the illustrative embodiment of the present invention, predetermined contacts 10 of the socket may have a resistance, inductance, capacitance, surface acoustical wave filters, or a combination thereof incorporated therein. A combination of resistance, inductance, capacitance, or surface acoustical wave filters may form a circuit therein. This additional impedance may be used for impedance matching purposes in order to reduce reflections or other noise mechanisms on a corresponding signal line. Further, the added impedance may be used to provide capacitive or inductive coupling to signal or power pins.

It is contemplated that predetermined ones of the active contacts 10 of the test socket may contact a number of signal traces on the load board. That is, each contact 10 may electrically communicate with, and nay be mechanically engaged with, a number of signals traces on the load board, including the particular signal trace which corresponds to the particular semiconductor device lead 14. For example, in the embodiment shown in FIG. 1, active contact 10 may be coupled to a first load board terminal 16 and a second load board terminal 22. It is contemplated that active contact 10 may be coupled to a plurality of load board terminals in a similar manner.

It is further contemplated that predetermined contacts 10 of the socket may have at least one active element incorporated thereon or therein. For example, active contact 10 may have a transistor, diode, etc., or a combination thereof incorporated therein, thereby forming a circuit. It is further contemplated that a combination of resistance, capacitance, inductance, transistors, diodes, surface acoustical wave filters, gates, etc. may be incorporated therein to form a circuit. In this embodiment, the impedance of the contact may be selectively controlled by another independent signal, as described in the previous paragraph, by the logic level of the contact itself, or other control means. In this embodiment, the active contact may have three ports 18, 20, and 24 as shown in FIG. 1.

Figure 2:
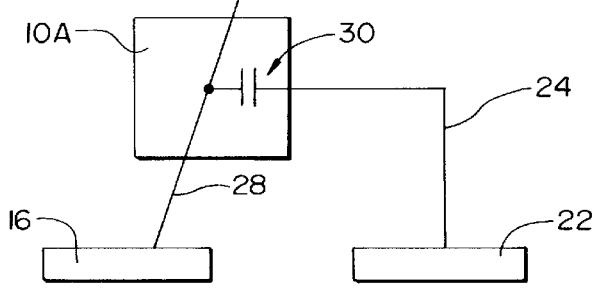
FIG. 2 is a schematic side view of an illustrative embodiment of the active contact whereby the active contact provides a capacitance between a packaged semiconductor device lead and a ground plane.

FIG. 2 is a schematic side view of an illustrative embodiment of an active contact 10A whereby the active contact 10A provides a capacitance to an interconnection 28 extending between the packaged semiconductor device lead 14 and load board terminal 16. In the illustrative embodiment, a capacitor 30 may have a first lead coupled to the interconnection 28 between the packaged semiconductor device lead 14 and load board terminal 16. The capacitor 30 may have a second lead coupled to load board terminal 22 via interface 24. In this configuration, load board terminal 22 may be grounded, thereby providing a capacitance between the interconnection 28 and ground. FIG. 2 is only illustrative, and it is contemplated that active contact 10A may comprise an inductor, resistor, diode, surface acoustical wave filter, or any other element which provides impedance and/or control thereto. It is further contemplated that active contact 10A may comprise any combination of the above reference elements thereby forming a circuit.

Figure 3:
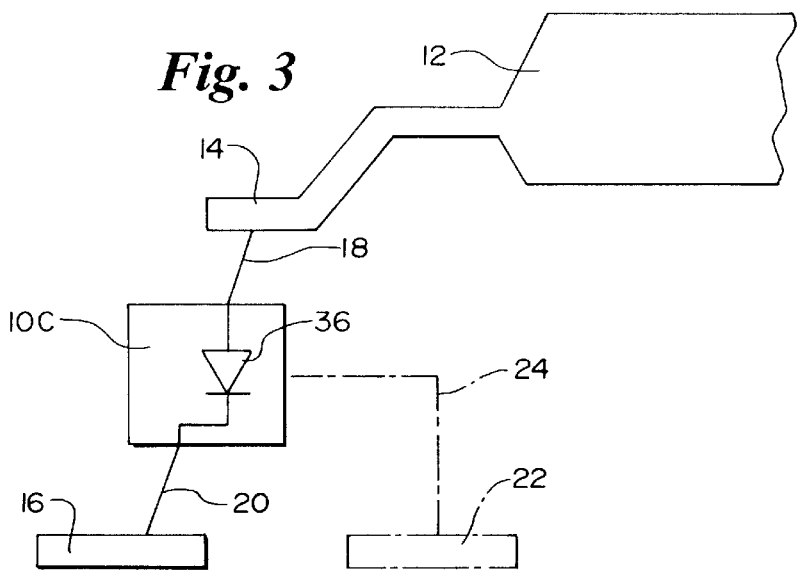
FIG. 3 is a schematic side view of an illustrative embodiment of the active contact whereby the active contact provides a diode means to the connection between a packaged semiconductor device and a terminal on an interface board.
Figure 4:
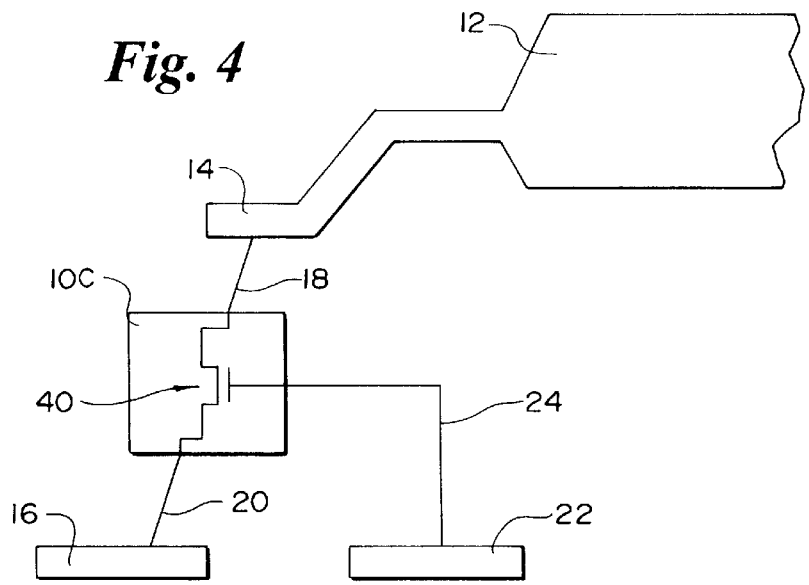
FIG. 4 is a schematic side view of an illustrative embodiment of the active contact whereby the active contact provides a switch means to the connection between a packaged semiconductor device and a terminal on an interface board.

FIGS. 3–4 show illustrative embodiments having active elements disposed on active contact 10. FIG. 3 shows a schematic side view of an illustrative embodiment of the active contact whereby an active contact 10B provides a diode means 36 between the packaged semiconductor device lead 14 and load board terminal 16. This configuration allows the semiconductor device 12 to supply current to load board terminal 16 but does not allow current to flow from load board terminal 16 into the semiconductor device 12. Similarly, FIG. 4 shows a schematic side view of an illustrative embodiment of the active contact whereby an active contact 10C provides a switch means between packaged semiconductor device lead 14 and lead board terminal 16. In the illustrative embodiment, the switch means may comprise a transistor 40 having a gate, source, and drain. The drain of the transistor 40 may be coupled to the semiconductor device lead 14 via interface 18, the source of the transistor 40 may be coupled to load board terminal 16 via interface 20, and the gate of the transistor 40 may be coupled to load board terminal 22 via interface 24. In this configuration, load board terminal 22 may control the impedance between load board terminal 16 and semiconductor device lead 14. Further, active contact 10C may have three ports 18, 20, and 24.

It is recognized that the inclusion of an active element into predetermined contacts 10 of a socket may have numerous applications. For example, a contact having a single transistor incorporated therein, as shown in FIG. 4, may be used to control whether the semiconductor device or the tester is driving a corresponding load board terminal. That is, the single transistor 40 may be turned off by applying an appropriate voltage to load board terminal 22, thereby substantially increasing the impedance of the path from the semiconductor device lead 14 to load board terminal 16, such that the tester may drive a corresponding load board terminal 16 without overdriving an output of the semiconductor device 12. Similarly, the single transistor 40 may be turned on by applying an appropriate voltage to load board terminal 22, thereby reducing the impedance of the path from the semiconductor device lead 14 to load board terminal 16, allowing the semiconductor device 12 to drive load board terminal 16 back to the tester, or visa-versa. This may be especially useful with semiconductor devices that have bi-directional input/output pins. It is recognized that this is only one application of the present invention and that numerous other applications are contemplated.

As stated above, it is further contemplated that a number of active elements may be incorporated into predefined contacts 10 of a socket to form a circuit therein. Inductors, capacitors, resistors, and/or surface acoustical wave filters may also be incorporated therein and combined therewith. In this embodiment, predefined contacts may "process" the corresponding signal in a predetermined manner, defined by the circuitry incorporated on active contact 10 itself. For example, a number of transistors may be incorporated in active contact 10 wherein the number of transistor may be arranged to provide an amplifier function. That is, the signal provided by the semiconductor device 40 or tester apparatus (not shown) may be amplified by active contact 10 of the socket. Other illustrative functions may include, but are not limited to, analog-to-digital conversion, digital-to-analog conversion, predefined logic functions, or any other function that may be performed via a combination of active and/or passive elements, including a microprocessor function.

Figure 5:
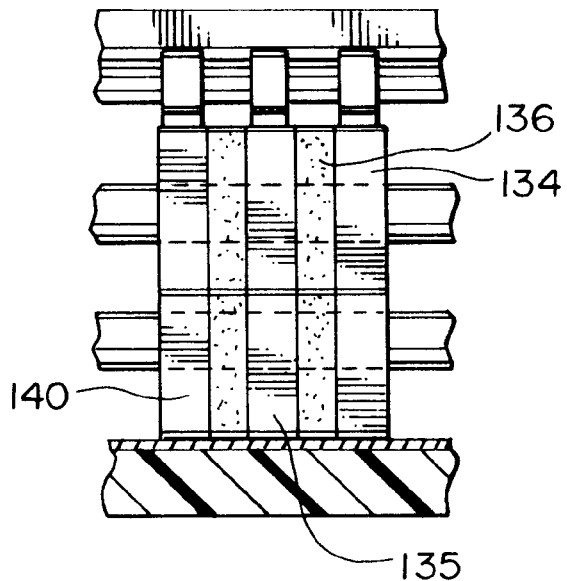
FIG. 5 is a top view of an illustrative embodiment of the active contacts whereby the active contacts are separated by a thin non-conducting layer to provide impedance therebetween.
Figure 6:
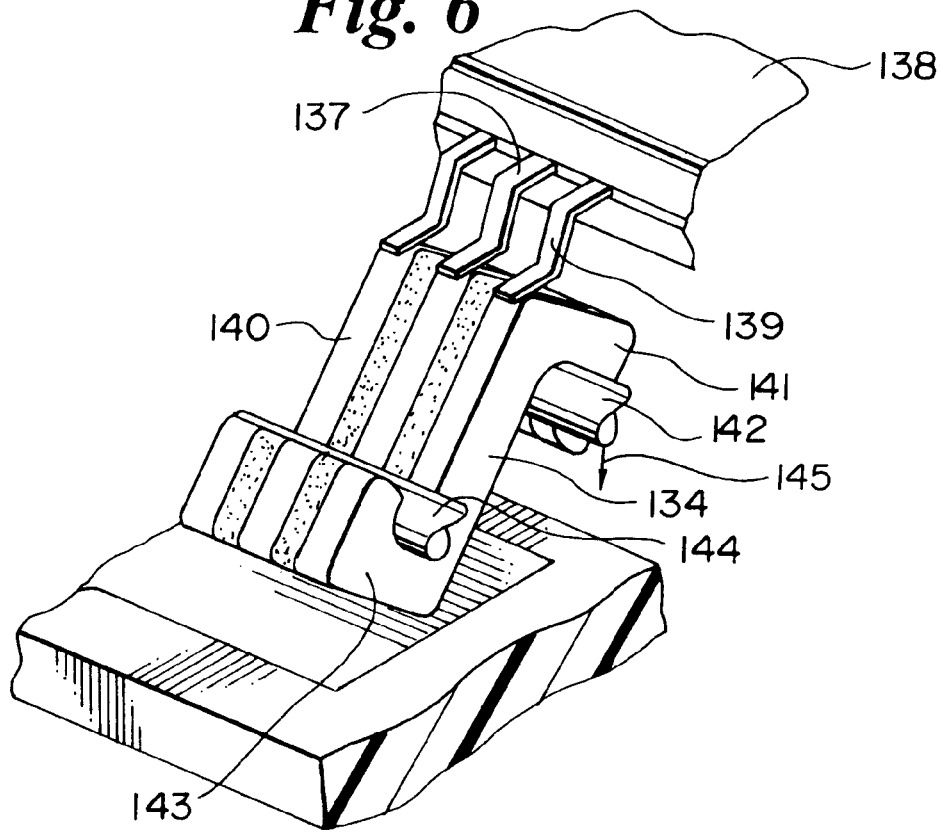
FIG. 6 is a perspective view of the embodiment shown in FIG. 5.

FIG. 5 is a top view of an illustrative embodiment of the active contacts whereby the active contacts are separated by a thin insulating material 136 to provide impedance therebetween. FIG. 6 is a perspective view of the embodiment shown in FIG. 5. In an illustrative embodiment, a number of "S" shaped contacts may be provided wherein each "S" shaped contact may engage a corresponding lead of a semiconductor device 138. A first hook portion 141 of each "S" shaped contact may engage a first elastomer element 142. A second hook portion 143 of each "S" shaped contact may engage a second element 144. The second element 144 may be constructed from a solid material or an elastomeric material. As a lead 137 of a semiconductor device 138 engages a corresponding "S" shaped contact 135, elastomer element 142 may deform thereby permitting "S" shaped contact 135 to deflect away from the corresponding semiconductor device lead 137. This may help compensate for non-planer device leads on a corresponding semiconductor device 138. Elastomer element 142 may be deformed in the direction of arrow 145 to provide a means of interchanging a first number of "S" shaped contacts with a second number of "S" shaped contacts by allowing the first hook portion 141 of each "S" shaped contact to be disengaged from elastomer element 142 so that the first number of "S" shaped contacts may be removed. The second number of "S" shaped contacts may be inserted so that the first hook portion 141 of each of the second number of "S" shaped contacts may engage the first elastomer element 142 and the second hook portion 143 of each "S" shaped contact may engage a second element 144.

Referring to FIGS. 5 and 6, the impedance may be formed between two components within the socket. For example, two parallel and adjacent contacts 134 and 135 may be separated by an insulating material 136 thereby forming a capacitance therebetween. One of the contacts 135 may be engaged by a power supply pin 137 on a corresponding semiconductor device 138 while an adjacent contact 134 may be engaged by a ground pin 139. This configuration provides capacitance between the power supply and ground, thereby reducing noise on the power supply of the semiconductor device 138.

The present embodiment may also be used to provide isolation between signal lines or signal lines and a power supply/ground if desired. That is, a contact 135 may be connected to ground and may be placed between two signal contacts 134 and 140 to reduce the amount of cross-talk therebetween. The contact may be shaped to control the amount of inductance on a given contact.

In one embodiment, a first contact 135, an insulating material 136, and a second contact 134 may be sandwiched together to form an impedance therebetween. This may be accomplished by using a conventional lamination process. In another embodiment, the first contact 135 and/or the second contact 134 may have an oxide coating placed thereon. The oxide coating may be grown on the outer surface of the contacts using a standard oxidation processes. In this configuration, the first contact 135 may be brought into direct contact with the second contact 134 while maintaining electrical isolation therebetween.

It is recognized that the above referenced embodiments are only illustrative, and that other embodiments which provide impedance between at least two components of a socket are contemplated.

Figure 7:
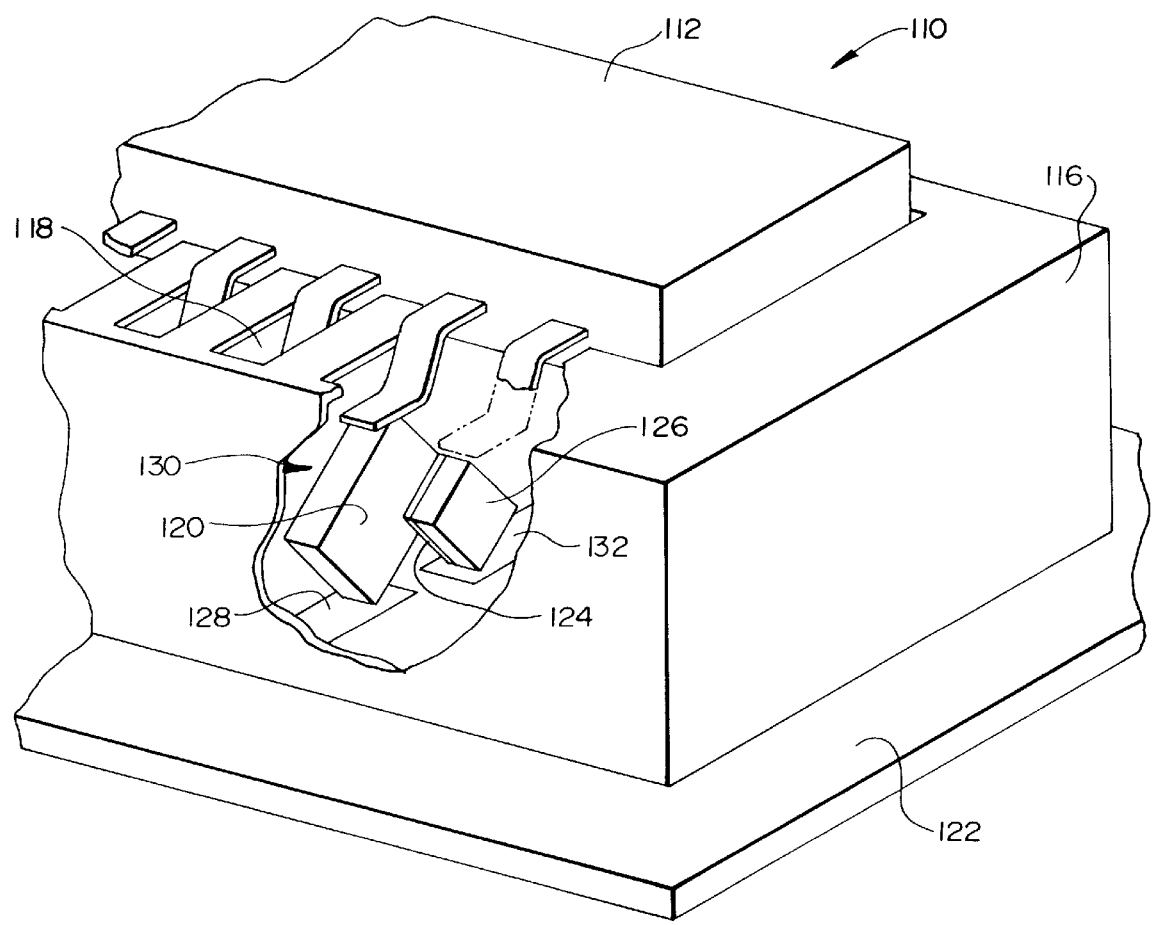
FIG. 7 is a partial fragmented perspective view of an illustrative embodiment of the present invention including a packaged semiconductor device and an interface board.

FIG. 7 is a partial fragmented perspective view of an illustrative embodiment of the present invention including a packaged semiconductor device and an interface board. As stated above, the controlled impedance may be provided on, or incorporated in, predetermined ones of the plurality of contacts. In the simplest embodiment, the resistance provided by the contact may be changed by varying the material or the shape thereof. In a more complex embodiment, and not deemed to be limiting, a metal substrate (MS) may be utilized to create a controlled impedance on predetermined ones of the plurality of contacts. For example, two or more metal planes may be mechanically joined and electrically insulated from one another in such a way as to form impedance controlled (i.e., stripline) electro-mechanical contacts. One metal plane may serve as the signal plane while an adjacent metal plane may serve as an electrical ground reference. Electrical insulation can be accomplished by a number of means, including, application of thermal-setting dielectric coatings including polyimides, epoxies, urethanes, etc., application of thermoplastic coatings including polyethylene, etc., or by growing native oxide by anodization or thermal growth. These varied approaches may allow for control of impedance through the adjustable parameters of the dielectric constant of the insulating material and the plane separation. Mechanical joining may be accomplished by a number of means, including, suspension by or between one or more elastomeric members and/or by referencing of the individual planes or sets of multiple planes within pre-defined mechanical constructs such as slots within a housing.

Essentially any metal may be used for this embodiment of the active contact. Aluminum is a preferred material since it is readily anodizable, and yields a good quality and well-characterized dielectric film. Other metals that may be used include, but are not limited to, copper and copper alloys, steels and Ni—Fe alloys, NiCr alloys, transition metals and alloys, and intermetallics. Some of these non-traditional contact metals may be useful either in a plated or non-plated embodiment to adjust and control the contact's bulk resistance.

Referring specifically to FIG. 7, a packaged semiconductor device 112 having at least one lead 114 may be received in a housing 116, such that the at least one lead 114 may be in electro-mechanical contact with an active contact 130. Semiconductor device 112 may be positioned in place by a lead channel 118 or other orienting means.

Active contact 130 may comprise a device element 120 and a plate 126. The device element 120 and the plate 126 may be constructed from a metallic material, as discussed above. The at least one lead 114 of semiconductor device 112 may be in electro-mechanical contact with a first portion of device element 120. Similarly, a second portion of device element 120 may be in electromechanical contact with a signal I/O pad 128 on a load board 122, thus completing a signal path from semiconductor device 112 to load board 122. Signal I/O pad 128 may be coupled to a tester or another element. Each active contact 130 may interchanged with any other active contact 130 to achieve the desired impedance.

Device element 120 may be mechanically bonded to plate 126 via a dielectric material 124 such that the two conducting surfaces, comprising device element 120 and plate 126, may be orientated parallel to one another and separated by a distance substantially equal to the thickness of dielectric material 124. Plate 126 may be electro-mechanically connected to a ground pad 132 on load board 122, such that the construct yields a transmission line structure such as a micro-strip type impedance controlled active contact. It is recognized that ground pad 132 may be coupled to a fixed voltage or to a tester. When connected to a tester, the voltage on ground pad 132 may be varied to provide a time varying impedance signature to the corresponding signal path.

In another embodiment utilizing a metal substrate as discussed above, a precise thickness of metal oxide may be grown on the surface of device element 130 and/or plate 126. The native grown metal oxide may function as the dielectric between device element 130 and plate 126. It is contemplated that the native grown metal oxide may comprise an inorganic oxide dielectric coating.

Another embodiment which utilizes the native grown metal oxide configuration is shown in FIG. 8. The active contact is generally shown at 150 and may comprise a first contact element 152 and a second contact element 154. A metal oxide 156 may be selectively grown on contact elements 152 and/or 154 such that no metal oxide is present on contacting surfaces 158A, 158B, or 158C. It is also contemplated that the metal oxide may be grown over the entire outer surface of contacting elements 152 and/or 154, and then selectively removed from contacting surfaces 158A, 158B, and 158C. Contacting surface 158A may be in electro-mechanical contact with a lead of a semiconductor device (not shown). Similarly, contacting point 158B may be in electro-mechanical contact with a signal I/O pad on a load board (not shown). Finally, contacting surface 158C may be in electro-mechanical contact with a ground pad on the load board (not shown).

In this configuration, first contact element 152 may be placed in contact with second contact element 154 at interface 156, while maintaining electrical isolation therebetween. Various metal plane configurations which allow adjustment and control of the electrical and mechanical interface characteristics are contemplated, including the shape of the contacting elements 152 and 154, the oxide thickness grown thereon, the mutual surface areas, the plane separation distance, and other parameters.

Finally, it is contemplated that a window 160, or multiple windows, may be incorporated into the design of the contacting elements 152 and 154. Window 160 may be employed as a conduit for a mechanically elastomeric member which may support the active contact 150. The elastomer member (not shown) may be used to provide an upward biasing of contact surface 158A such that as a semiconductor lead is brought into engagement therewith, the elastomer member may deform thereby permitting active contact 150 to deflect away from the semiconductor device lead. This may help compensate for non-planer device leads on a corresponding semiconductor device.

Another illustrative embodiment that may use the metal substrate concept discussed above is shown in FIG. 9. In this embodiment, a known precise thickness of thermal setting or thermoplastic dielectric 124 may be laminated between two or more metal plates 120 and 126 in order to achieve the desired electro-mechanical characteristics. It is contemplated that the two or more metal plates may comprise two or more isolated circuits. That is, each of the two or more metal plates may comprise a circuit function. It is further contemplated that a dielectric 124 may be constructed from polyimide, epoxy, polycarbonate, polyphenylene sulfide, or any other suitable material. An etch-back of the dielectric 124 may be incorporated into the fabrication process to facilitate ohmic contact on contacting surfaces 158D, 158E, and 158F.

In another embodiment of the present invention, a ceramic substrate may be utilized to create a controlled impedance on predetermined ones of a plurality of contacts. For example, patterned metal may be fabricated on a ceramic substrate in such a way as to yield an impedance controlled electromechanical contact. In an illustrative embodiment, a conventional thin-film multi-layer technology may provide a 3-terminal type capacitor wherein the first two terminals may correspond to a signal I/O and the third terminal may be in contact with a ground reference. It is also contemplated that the same impedance controlled 3-terminal type capacitor could be fabricated by a modified multilayer thin-film process wherein the conductive phase is deposited on an inert/carrier substrate and patterned for selective oxidation using chemical anodization, plasma oxidation and/or thermal oxide growth, yielding conductive metal patterns within a dielectric. Finally, it is contemplated that the process may be repeated N-times to yield a multi-layer active contact structure of the 3-terminal type capacitor.

While the last two embodiments primarily provide an illustrative three terminal capacitor type device, it is envisioned that other conventional processes may be used to provide resistance, inductance, capacitance, surface acoustical wave filter, and/or a combination thereof to predetermined contacts. It is further envisioned that conventional or other processes may be used to provide other active elements including, transistors, diodes, etc., and/or a combination thereof to predetermined contacts. Finally, it is envisioned that conventional or other processes may be used to provide a number of active and/or passive elements to provide a circuit which may provide predefined functions, including a microprocessor function to predetermined contacts. That is, in an alternative embodiment, predetermined ones of the above referenced multi-layers each may comprise an isolated circuit.

In an illustrative embodiment, as shown in FIG. 10, a ceramic substrate 202 having a first contacting surface 158G and a second contacting surface 158H may be provided. A metal film may be deposited directly on the ceramic substrate. Subsequently, the metal film may be patterned via an etch or other subtractive process to form a first conducting surface 204 and a second conducting surface 206. The metal film may cover the first contacting surface 158G and the second contacting surface 158H to provide a conductive surface thereto. In the illustrative embodiment, there may be a gap between the first conductive surface 204 and the second conductive surface 206 such that there is no electrical connection therebetween. A discrete and/or monolithically fabricated active components may be affixed such that a first electrical terminal 210 of the discrete and/or monolithically fabricated active component is in electrical communication with the first conductive surface 204, as at 211, and a second electrical terminal 212 of the discrete and/or monolithically fabricated active component 208 is in electrical communication with the second conductive surface 206, as at 213. Each component 208 may be interchanged with any other component 208. It is contemplated that the discrete and/or monolithically fabricated active component may be a resistor, capacitor, inductor, diode, or any combination thereof. Further, it is contemplated that the shape of the ceramic substrate and the pattern of the metal film may be such that a transistor or other multi-terminal device may be employed. Finally, it is contemplated that a number of resistors, capacitors, inductors, diodes transistors, etc. may be employed to create a circuit thereon.

In the illustrative embodiment, the employment of low conductivity metals or even conductive inks and ceramics, including SiC, may be used to achieve the desired resistance values, with or without additive plating such as gold to minimize contact resistance. However, it is contemplate that an additive plating may be used. The ohmic contacting surfaces 158G and 158H of active contact 200 may be in electromechanical contact with a semiconductor lead and a load board terminal, respectively. The first conductive surface 204 may carry an electrical signal from the semiconductor lead to the first electrical terminal 210 of the discrete or integrated component 208. The signal may emerge at the second electrical terminal 212 of the discrete or integrated component 208 and may be carried by the second conductive surface 206 to the ohmic contacting surface 158H, and finally to a load board's signal I/O pad (not shown). In the embodiment shown in FIG. 10, a recess may be fabricated in the ceramic subtract to accommodate the physical placement of the discrete and/or monolithically fabricated active component 208.

Referring to FIG. 11, another illustrative embodiment which uses the ceramic substrate, may comprise a 3-terminal capacitor type active contact. In this embodiment, the contact may comprise a multi-layer monolithic decoupling capacitor. Alternating signal planes 258 and ground planes 266 may be fabricated from patterned metal and separated by inter-layer ceramic dielectric (not shown). This may be accomplished by repeating a multi-layer thin film process N-times to yield a multi-layer active contact structure as shown in FIG. 11.

The network of signal planes 258 may be coupled to a first terminal 254 by a via 256, and to a second terminal 260 by a via 268. The first terminal 254 may be brought into engagement with a lead of a semiconductor device. The second terminal 260 may be in contact with a signal I/O pad 128 on a load board (not shown). The ground network 266 may be electrically coupled to a ground reference ohmic contact 262 by a via 264. The ground reference ohmic contact 262 may be coupled to a ground reference pad 132 on a load board (not shown). This embodiment may provide a significant amount of control over a corresponding signal because of the relatively large plate area generated by the alternating configuration of the signal and ground planes.

Having thus described the preferred embodiments of the present invention, those of skill in the art will readily appreciate that the teachings found herein may be applied to yet other embodiments within the scope of the claims hereto attached.

We claim:

1. Connector apparatus for transmitting a plurality of signals between a plurality of first terminals and a plurality of second terminals, comprising:

(a) a plurality of rigid contacts, each for electro-mechanically coupling one of the plurality of first terminals to a corresponding one of the plurality of second terminals, predetermined ones of said plurality of contacts comprising an integrated electrical affecting means wherein a first conductive surface of said electrical affecting means is coupled to a corresponding one of the plurality of first terminals, a second conductive surface of said electrical affecting means is coupled to said corresponding one of the plurality of second terminals, said second conductive surface not in electrical communication with said first conductive surface, said electrical affecting means being received within a window formed in each contact, spaced from surfaces defining said window, and affecting a corresponding one of the plurality of signals as said corresponding one of the plurality of signals is transmitted between said corresponding one of the plurality of first terminals and said corresponding one of the plurality of second terminals; and (b) biasing means for engaging said plurality of contacts such that, as each one of said plurality of contacts is engaged by a corresponding one of the plurality of first terminals, said biasing means permits movement of said corresponding contact in response thereto;

(c) wherein said electrically affecting means comprises a controlled impedance; and (d) wherein said controlled impedance comprises a component having a first terminal and a second terminal, said first terminal being coupled to said first conductive surface and said second terminal being coupled to said second conductive surface, whereby the corresponding one of the plurality of signals passes between said first conductive surface, said first terminal of said component, said second terminal of said component, and said second conductive surface.

2. Connector apparatus according to claim 1 wherein said component comprises a discrete component.

3. Connector apparatus according to claim 2 wherein said component comprises a monolithically fabricated component.

4. Connector apparatus according to claim 3 wherein said ceramic substrate has a recess therein to accommodate the physical placement of said component.

5. Connector apparatus according to claim 1 wherein said controlled impedance is provided by a first contact of the plurality of contacts and a second contact of the plurality of contacts, said first contact and said second contact being electrically separated by an insulating material.

6. Connector apparatus for transmitting a plurality of signals between a plurality of first terminals and a plurality of second terminals, comprising:

(a) a plurality of rigid contacts for electro-mechanically coupling each one of the plurality of first terminals to a corresponding one of the plurality of second terminals, predetermined ones of said plurality of contacts comprising:

i a ceramic substrate having an outer surface;

ii a first conductive surface deposited on a first portion of said outer surface, said first conductive surface being coupled to a corresponding one of the plurality of first terminals;

iii a second conductive surface deposited on a second portion of said outer surface, said second conductive surface not in electrical communication with said first conductive surface, said second conductive surface being coupled to said corresponding one of the plurality of second terminals;

iv a component having a first terminal and a second terminal, said first terminal being coupled to said first conductive surface and said second terminal being coupled to said second conductive surface, whereby a corresponding one of the plurality of signals passes between said first conductive surface, said first terminal of said component, said second terminal of said component, and said second conductive surface, said component electrically affecting said corresponding one of said plurality of signals; and (b) biasing means for engaging said plurality of contacts such that as each one of said plurality of contacts is engaged by a corresponding one of the plurality of first terminals, said biasing means permits movement of said corresponding contact in response thereto.

* * * * *